(12) United States Patent
Mulvey et al.

(10) Patent No.: US 6,502,201 B1
(45) Date of Patent: Dec. 31, 2002

(54) DETERMINATION OF FREQUENCY OF TIMER TICKS

(75) Inventors: Donald Lawrence Mulvey, Round Rock, TX (US); Enio Manuel Pineda, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/417,825

(22) Filed: Oct. 14, 1999

(51) Int. Cl.[7] .................................................. G06F 1/04
(52) U.S. Cl. ........................ 713/500; 713/501; 713/503; 370/253
(58) Field of Search ................................ 713/501, 503, 713/400; 370/252, 395, 503, 327; 711/202, 148

(56) References Cited

U.S. PATENT DOCUMENTS

| | | | | |
|---|---|---|---|---|
| 4,093,850 A | | 6/1978 | Karnowski et al. ...... 235/92 TF |
| 4,257,005 A | * | 3/1981 | Hall ........................... 324/166 |
| 4,301,405 A | | 11/1981 | Carlson ..................... 324/78 D |
| 4,395,762 A | * | 7/1983 | Wondergem et al. ....... 364/484 |
| 4,779,044 A | * | 10/1988 | Skolnick et al. .......... 324/77 R |
| 4,882,545 A | * | 11/1989 | Plant ........................... 328/138 |
| 5,077,519 A | | 12/1991 | Markow et al. .......... 324/78 D |
| 5,128,607 A | * | 7/1992 | Clark et al. ............... 324/78 D |
| 5,255,291 A | | 10/1993 | Holden et al. .............. 375/111 |
| 5,379,390 A | * | 1/1995 | Searing et al. ............. 395/375 |
| 5,768,573 A | | 6/1998 | Dixon ........................ 395/557 |
| 5,912,880 A | * | 6/1999 | Bernstein .................... 370/252 |

* cited by examiner

*Primary Examiner*—Zarni Maung
*Assistant Examiner*—Jinsong Hu
(74) *Attorney, Agent, or Firm*—David A. Mims, Jr.; Robert V. Wilder

(57) ABSTRACT

A method and implementing computer system is provided in which the actual frequency of system timing signals is determinable. In one example, an output from a programmable interrupt timer is selectively sampled and a determination is made of the actual frequency of the interrupt signal. A user may indicate the number of samples upon which the frequency calculation will be based and the determined actual frequency in real time is saved for reference as needed by system requirements and other applications. In one embodiment, the number of samples and the calculated actual interrupt timer frequency, as well as other related information such as time and date of the latest calculation, is presented on a user display device.

20 Claims, 2 Drawing Sheets

DETERMINATION OF FREQUENCY OF TIMER TICKS

FIELD OF THE INVENTION

The present invention relates generally to information processing systems and more particularly to a methodology and implementation for determining the frequency of system interrupt timing pulses.

BACKGROUND OF THE INVENTION

Computer systems today rely on internal timing signals which are derived from a system clock signal. Programmable timing circuits, using the system clock signal as a primary reference, provide a series of system timing signals which are, in turn, referred to and used for various functions within the system.

One of the inherent sub-systems in a computer system is the generation of interrupt request (IRQ) signals. The purpose of the IRQ signals is to provide a periodic reference time at which the various sub-systems in the computer can request use of the system processor for example.

Current computer systems generally include a programmable interval timer circuit to provide the interrupt signals. The timer interrupt rate or frequency of the interrupt signal is determined by how a programmable interval timer integrated circuit (IC) is programmed. In the absence of a programmed value, a default rate is applied by the system. For example, in one commercially available interval timer circuit, a default rate of 18.2 interrupts per second is set. However, the interrupt rate on a given system can be changed, for example, by an operating system port I/O or by user written device drivers. Thus, the actual frequency of the IRQ signal may not be readily available.

This presents a problem for system performance analysts for example who need to use a sampling technique in analyzing system performance. Using a sampling technique, for example, sample readings are taken on every timer interrupt pulse in order to evaluate system performance. Typically, the address of the code that is interrupted is taken along with the related process and thread identifications. This information is typically recorded for later analysis. However, since the timer interrupt frequency can be changed, and since an accurate value of the actual timer interrupt frequency is needed in order to control analysis tools sample rates, and there is no current way of reading the frequency programmed into the interval timer circuit, there is a need to be able to determine a real time value of the timer interrupt rate on-demand, in order to understand the data collected.

Thus, there is a need for an improved methodology and implementing system which enables an on-demand determination of the actual real time frequency of system timing signals.

SUMMARY OF THE INVENTION

A method and implementing computer system is provided in which the actual frequency of system timing signals is determinable. In one example, an output from a programmable interrupt timer is selectively sampled and processed in order to determine the actual frequency of the interrupt signal. A user may indicate the number of samples upon which the frequency calculation will be based and the determined actual frequency in real time is saved for reference as needed by system requirements and other applications. In one embodiment, the calculated actual interrupt timer frequency, as well as other related information such as time and date of the latest calculation, is presented on a user display device.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
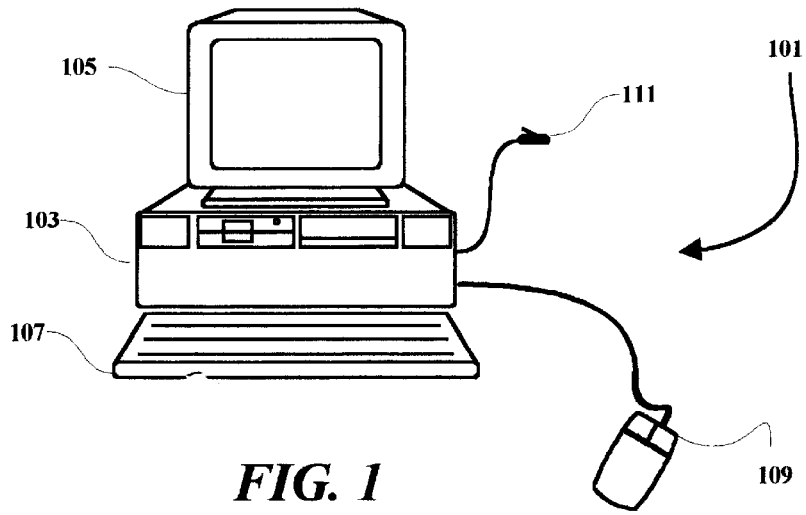
FIG. 1 is a diagram of a computer system in which the present invention may be implemented.

The various methods discussed herein may be implemented within a typical computer system which may include a workstation or personal computer. In general, an implementing computer system may include a plurality of processors in a multi-bus system in a network of similar systems. However, since the workstation or computer system implementing the present invention in an exemplary embodiment, is generally known in the art and composed of electronic components and circuits which are also generally known to those skilled in the art, circuit details beyond those shown in the drawings are not specified to any greater extent than that considered necessary as illustrated, for the understanding and appreciation of the underlying concepts of the present invention, and in order not to obfuscate or distract from the teachings of the present invention.

In FIG. 1, a computer system 101 includes an electronics enclosure 103 which is typically arranged for housing one or more CPUs (central processing units) along with other component devices and subsystems of the computer system 101. The computer system 101 also includes a monitor or display unit 105, a keyboard 107 and a mouse or pointing device 109, which are all interconnected within the illustrated computer system. Also shown is a connector 111 which is arranged for connecting a modem within the computer system to a communication line such as a telephone line in the present example.

Figure 2:
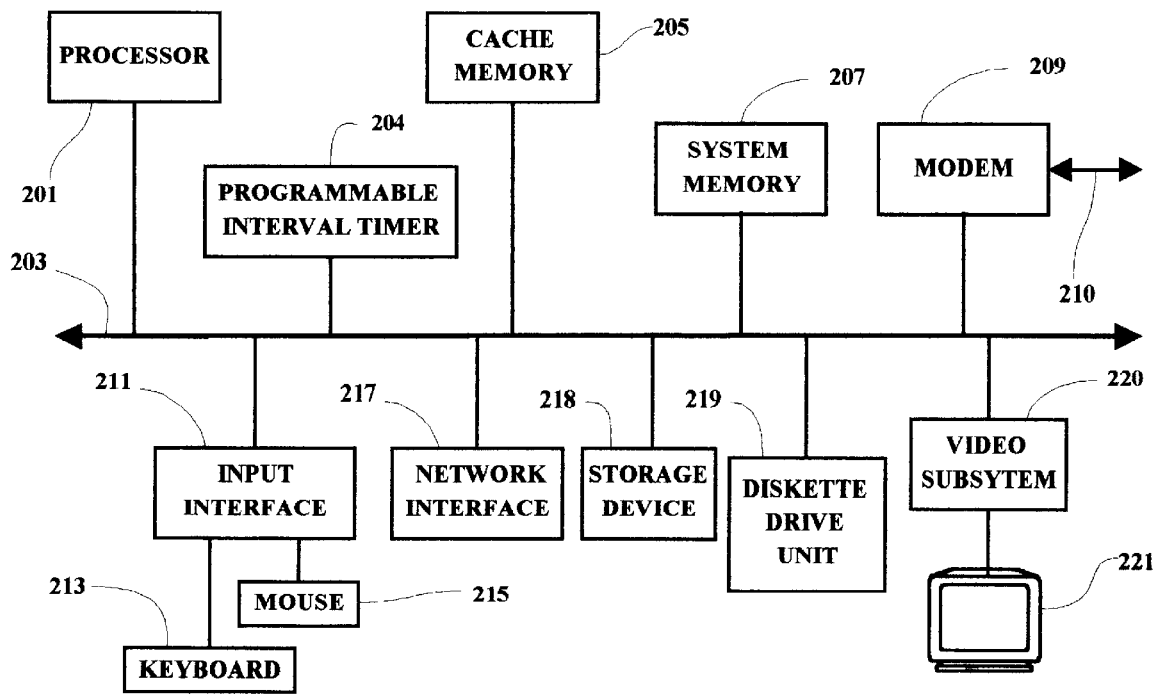
FIG. 2 is a simplified schematic diagram showing selected components and subsystems of the computer system illustrated in FIG. 1.

Several of the major components of the system 101 are illustrated in FIG. 2. A processor circuit or CPU 201 is connected to a system bus 203 which may be any host system bus. The exemplary computer system includes a programmable interval timer circuit 204 connected to the system bus 203. The interval timer 204 may be, for example, an Intel 82C54 Programmable Interval Timer. The interval timer is used to provide various timing signals for use within the computer system. A cache memory device 205, and a system memory unit 207 are also connected to the bus 203. A modem 209 is arranged for connection 210 to a communication line, such as a telephone line, through a connector 111 (FIG. 1). The modem 209, in the present example, selectively enables the computer system 101 to establish a communication link and initiate communication with another computer system, or network or database server.

The system bus 203 is also connected through an input interface circuit 211 to a keyboard 213 and a mouse or pointing device 215. The bus 203 is also coupled to a separate network subsystem interface 217 and a diskette drive unit 219. A video subsystem 220, which may include a graphics subsystem, is connected to a display device 221. A is storage device 218, which may comprise a hard drive unit or CD ROM, is also coupled to the bus 203. The diskette drive unit 219 provides a means by which individual diskette programs may be loaded on to the hard drive, or accessed directly, for selective execution by the computer system 101.

The programmable interval timer 204 in the present example generates accurate time delays under software control. Internal counters may be programmed for desired delays. After the desired delay, the interval timer will interrupt the CPU 201. However, as hereinbefore noted, there is no current way of knowing, after the fact, at what frequency the IRQ signal has been programmed to operate. In accordance with the present invention, the IRQ frequency may be calculated on-demand, and saved in memory for reference by other applications. The determined actual IRQ frequency may also be displayed to a user, for example to a performance analyst, in order to provide a positive real-time measurement of the interrupt signal frequency for use in evaluating system performance.

In the exemplary embodiment, the interrupt signal or "timer tick" frequency is determined by sampling "n" number of timer ticks in the first level interrupt handler and calculating the average time between "ticks". The number of samples requested can be user selectable, for example, from a selection screen. The calculated real-time interrupt signal frequency based on the selected number of samples taken, is displayed to a user and also saved in memory for reference.

default number of samples is requested. A counter is then incremented 305 to keep track of the number of samples taken. On the first pass through the process, 307, the interrupt cycle counter or processor time stamp counter is read and the reading is saved as CYCLE_START 309, and the process returns to continue handling timer interrupts 311. On the next pass, through the sampling processing, a check is made to determine if the number of samples taken is equal to or greater than the number of samples requested 313 (either by user input or by default). The sampling will continue until the number of samples taken is equal to the number of samples requested 313 and at that point the cycle or processor time stamp counter is read and saved as CYCLE_END 315 for example. The timer interrupt frequency is then calculated 317 and saved 319. A samples-requested register is reset to zero 321 and timer interrupt processing continues 311. In addition to the step of saving 319, the calculated actual real-time timer interrupt frequency determined at step 317 may also be displayed (not shown) to the user on the display device 105 or 221, along with other related information such as the time and date that the determination was last made. The calculated real-time timer interrupt frequency 319 is also available as saved for reference by other applications as desired.

One of many exemplary pseudo-code listings which may be implemented to accomplish the illustrated methodology is shown below:

```
if (#OfSamplesRequested !=0) {
    if (FirstTime) {
        Read Processor Time Stamp Counter (TSC) Register.
        Save value as Cycle_start
    }
    else {
        Increment #OfSamplesTaken
        if (#OfSamplesTaken == #OfSamplesRequested) {
            Read Processor Time Stamp Counter(TSC) Register.
            Save value as Cycle_end
            Calculate Interrupt Frequency;
            (Cycle_end − Cycle_start0 / (CPU FreqInMHz * #OfSamplesRequested)
            Save Result
            #OfSamplesRequested = 0           // DONE
        }
    }
}
```

On the first "tick" after initializing the process, a CPU time stamp counter register is read to record the initial time stamp. On subsequent ticks, a counter is incremented until it reaches the requested count for sample requested. On the last tick, the time stamp counter register is again read to obtain the ending time stamp. The difference in the timestamps (which are actually clock cycles) is determined and using that information, and the CPU frequency, the time stamp difference is converted to time, averaged over the number of cycles and returned to the caller. This method is illustrated in the exemplary flow chart of FIG. 3.

Figure 3:
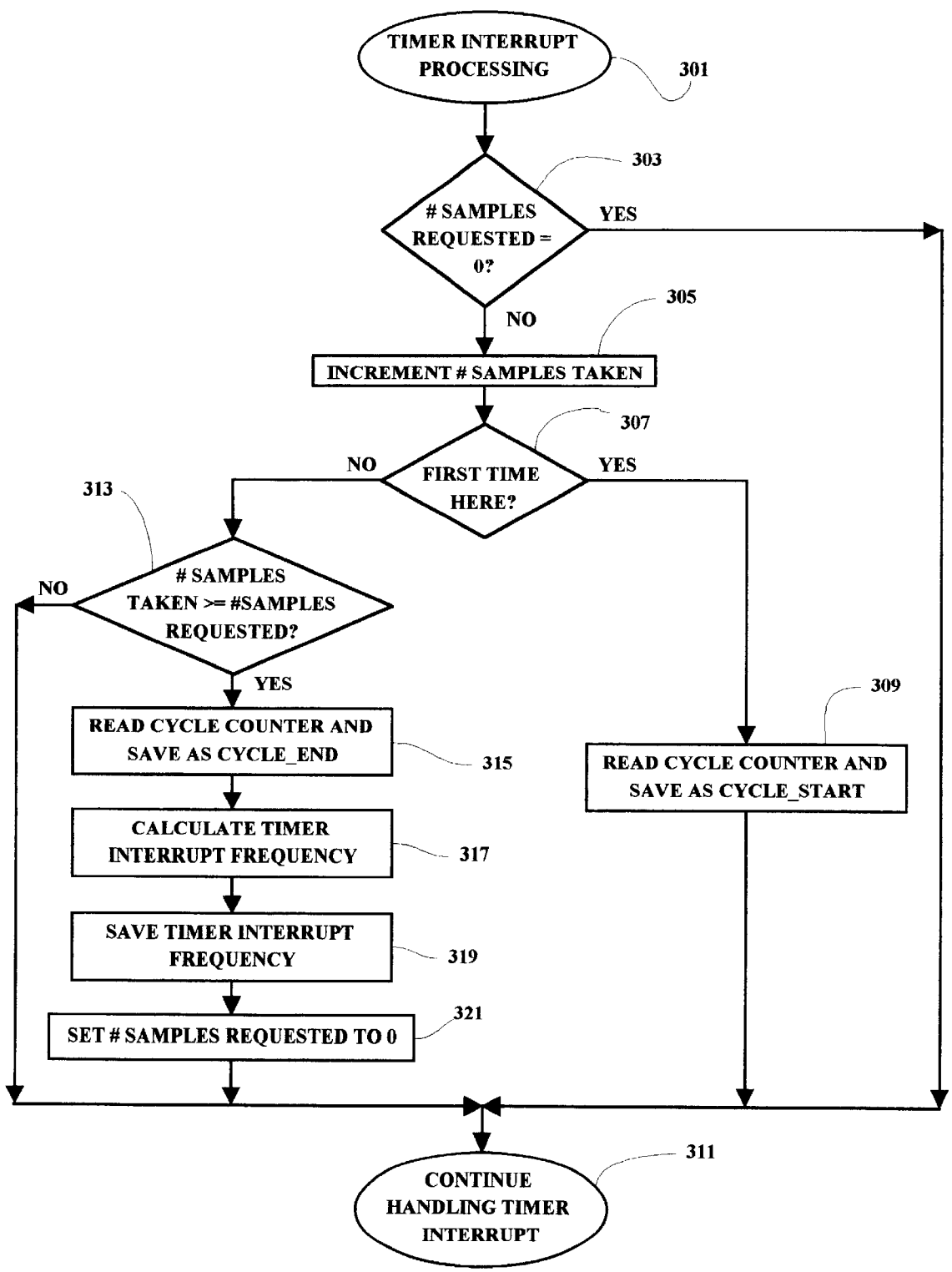
FIG. 3 is a flow chart of an exemplary operational sequence in a determination of the actual frequency of a system interrupt signal.

In FIG. 3, as part of timer interrupt processing 301, a check is made to determine if the number of samples requested is equal to zero 303. If there are no samples requested, the process continues to handle timer interrupts in a standard manner. However, if it is determined that there are a number of samples requested 303, that means a user has requested a determination of the actual timer interrupt frequency and input a number of samples to be taken or a The above code is executed on every timer interrupt as part of handling of the interrupt. The calculation process starts when a requester sets a non-zero value in a "#OfSamplesRequested" register for example. On the next timer interrupt, the calculation process starts and continues for the "#OfSamplesRequested" timer interrupts. Upon completion, the "#OfSamplesRequested" is set to the value zero and the calculated timer interrupt frequency is stored as a system variable accessible to a requester or other application. Once a requester initiates a request, it should "sleep" (i.e. suspend or block) and periodically "wake-up" and check whether the "#OfSamplesRequested" has gone to zero which designates the end of the sampling process. The process may also be implemented such that requesters will not be able to initiate a request to determine the real-time interrupt timer frequency if the "#OfSamplesRequested" at the time of the request is a non-zero value.

The method and apparatus of the present invention has been described in connection with a preferred embodiment as disclosed herein. The disclosed methodology may be implemented in a wide range of sequences to accomplish the desired results as herein illustrated. Although an exemplary embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. The disclosed methodology may also be implemented solely in program code stored on a disk or diskette (portable or fixed), or other memory device, from which it may be executed to achieve the beneficial results as described herein. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for enabling a determination of an interrupt timing frequency of an interrupt signal, said method comprising:
    enabling a user to provide an input signal, said input signal being representative of a request to make a determination of said interrupt timing frequency over a user-specified number of cycles of said interrupt signal;
    counting a passage of a number of cyclic points of said interrupt signal during said user-specified number of cycles;
    determining an amount of time elapsed during said counting;
    calculating said interrupt timing frequency of said interrupt signal by dividing said number of cycles by said amount of time elapsed; and
    saving a value representative of said interrupt timing frequency in memory.

2. The method as set forth in claim 1 and further including:
    displaying said calculated interrupt timing frequency on a display device.

3. The method as set forth in claim 2 and further including:
    displaying a time reference representative of when said calculating was accomplished, said time reference being displayed along with said calculated interrupt timing frequency on a display device.

4. The method as set forth in claim 1 wherein said predetermined number is a set default number.

5. The method as set forth in claim 1 wherein said input signal is effected by a user operating an input device.

6. The method as set forth in claim 5 wherein said predetermined number is determined by a user input at said input device.

7. The method as set forth in claim 2 wherein said predetermined number is a set default number.

8. The method as set forth in claim 2 wherein said input signal is effected by a user operating an input device.

9. The method as set forth in claim 8 wherein said predetermined number is determined by a user input at said input device.

10. The method as set forth in claim 3 wherein said predetermined number is a set default number.

11. The method as set forth in claim 3 wherein said input signal is effected by a user operating an input device.

12. The method as set forth in claim 11 wherein said predetermined number is determined by a user input at said input device.

13. The method as set forth in claim 1 wherein said elapsed time is determined by determining a difference between start counter and end counter readings, said start counter and end counter readings being taken from a processor timing register at beginning and ending times for said counting.

14. The method as set forth in claim 13 and further including:
    determining a clock frequency of said processor; and
    determining said elapsed time by relating said difference to said processor clock frequency.

15. A storage medium including machine readable coded indicia, said storage medium being selectively coupled to a reading device, said reading device being selectively coupled to processing circuitry within a computer system, said reading device being selectively operable to read said machine readable coded indicia and provide program signals representative thereof, said program signals being effective to enable a determination of an interrupt timing frequency of an interrupt signal, said program signals being selectively operable to effect the steps of:
    enabling a user to provide an input signal, said input signal being representative of a request to make a determination of said interrupt timing frequency over a user-specified number of cycles of said interrupt signal;
    counting a passage of a number of cyclic points of said interrupt signal during said user-specified number of cycles;
    determining an amount of time elapsed during said counting;
    calculating said interrupt timing frequency of said interrupt signal by dividing said number of cycles by said amount of time elapsed; and
    saving a value representative of said interrupt timing frequency in memory.

16. The medium as set forth in claim 15 wherein said program signals are further selectively operable to effect the step of:
    displaying said calculated interrupt timing frequency on a display device.

17. The medium as set forth in claim 15 wherein said program signals are further selectively operable to effect the step of:
    displaying a time reference representative of when said calculating was accomplished, said time reference being displayed along with said calculated interrupt timing frequency on a display device.

18. An information processing system comprising:
    a bus;
    a processor coupled to said bus;
    a memory device coupled to said bus;
    an interrupt signal generating device coupled to said bus, said interrupt signal generating device being selectively programmable for generating an interrupt signal having an interrupt timing frequency;
    an input device coupled to said bus, said input device being selectively operable to enable a user to provide an input signal, said input signal being representative of a request to make a determination of said interrupt timing frequency over a user-specified number of cycles of said interrupt signal; and a display device coupled to said bus, said information processing system being selectively operable for enabling receipt of said input signal from said input device, said information processing system being further operable for counting a passage of a number of cyclic points of said interrupt signal in response to said input signal and determining an amount of time elapsed during said counting, said information processing system being further operable for calculating said interrupt timing frequency of said interrupt signal by dividing said number of cycles by said amount of time elapsed, and saving a value representative of said interrupt timing frequency in said memory device.

19. The information processing system as set forth in claim 18 wherein said information processing system is further selectively operable for displaying said calculated interrupt timing frequency on said display device.

20. The information processing system as set forth in claim 19 wherein said information processing system is further selectively operable for displaying a time reference representative of when said calculating was accomplished, said time reference being displayed along with said calculated interrupt timing frequency on said display device.

* * * * *